(12) United States Patent
Zaghloul

(10) Patent No.: US 7,289,063 B2
(45) Date of Patent: Oct. 30, 2007

(54) LTCC-BASED MODULAR MEMS PHASED ARRAY

(75) Inventor: Amir I. Zaghloul, Bethesda, MD (US)

(73) Assignee: Comsat Corporation, Bethesda, MD (US)

( * ) Notice: Subject to any disclaimer, the term of this patent is extended or adjusted under 35 U.S.C. 154(b) by 0 days.

(21) Appl. No.: 10/474,818

(22) PCT Filed: Apr. 12, 2002

(86) PCT No.: PCT/US02/08258

§ 371 (c)(1),
(2), (4) Date: Oct. 14, 2004

(87) PCT Pub. No.: WO02/085040

PCT Pub. Date: Oct. 24, 2002

(65) Prior Publication Data

US 2005/0040988 A1     Feb. 24, 2005

Related U.S. Application Data

(60) Provisional application No. 60/283,915, filed on Apr. 13, 2001.

(51) Int. Cl.
*H01Q 1/38* (2006.01)

(52) U.S. Cl. .............................. 343/700 MS; 343/853; 29/600; 29/601

(58) Field of Classification Search .......... 343/700 MS
See application file for complete search history.

(56) References Cited

U.S. PATENT DOCUMENTS

| | | | | |
|---|---|---|---|---|
| 6,154,176 A | * | 11/2000 | Fathy et al. | 343/700 MS |
| 6,781,065 B1 | * | 8/2004 | Palmteer | 174/260 |
| 2003/0143884 A1 | * | 7/2003 | Kung et al. | 439/342 |
| 2004/0113840 A1 | * | 6/2004 | Gottwald et al. | 343/700 MS |
| 2004/0130490 A1 | * | 7/2004 | Jenabi | 343/700 MS |
| 2004/0252059 A1 | * | 12/2004 | Zaghloul et al. | 343/700 MS |
| 2005/0057415 A1 | * | 3/2005 | Rawnick et al. | 343/795 |

* cited by examiner

*Primary Examiner*—Don Wong
*Assistant Examiner*—Binh V Ho
(74) *Attorney, Agent, or Firm*—Sughrue Mion, PLLC

(57) ABSTRACT

The present invention uses low temperature co-fired ceramic (LTCC) technology for fabrication of micro-electro-mechnical systems (MEMS) based phase shifters. As a result, low-cost subarray modules can be constructed using LTCC, and the subarray modules (10) can be used as building blocks for large antenna arrays. In an exemplary description of the present invention, all layers of the multilayer subarray modules, including MEMS, are in LTCC. As a result, a significant cost reduction for satellite terminals using highly integrated LTCC subarray modules.

25 Claims, 2 Drawing Sheets

LTCC-BASED MODULAR MEMS PHASED ARRAY

This application claims the benefit of U.S. Provisional Application No. 60/283,915, filed Apr. 13, 2001, under 35 U.S.C. § 119(e).

BACKGROUND OF THE INVENTION

1. Field of the Invention

The present invention relates to a method of efficiently fabricating a low-cost phased array. More specifically, the present invention relates to a multilayer phased array and method of fabrication thereof, using low temperature co-fired ceramic (LTCC)— based layers, some of which are micro-electromechanical system (MEMS) layers.

2. Background of the Invention

In the related art, micro-electromechanical system (MEMS) technology integrates the silicon substrate of printed-circuit and computer technologies with tiny mechanical devices. For example, but not by way of limitation, MEMS technology may include sensors, valves, gears, mirrors, switches or actuators embedded in semiconductor devices.

While the related art electronics of MEMS devices are fabricated via an Integrated Circuit (IC) process, the micromechanical MEMS components are fabricated by a micromachining process that selectively etches or adds layers to form the MEMS device. Once produced, the micromechanical components form sensory and mechanical parts of a MEMS device, while the electronics part forms the "brain" of a MEMS device. Accordingly, MEMS combines the computational ability of microelectronics with control capabilities of microsensors and microactuators. In related art communications systems, the combination of silicon and micromachining allows for very high bandwidth mechanical devices.

Related art MEMS devices are manufactured using techniques that are substantially similar to the related art IC fabrication processes. For example, but not by way of limitation, a batch fabrication process may be used to make a MEMS device.

The modular concept of multilayer active phased arrays is the subject of co-pending International Application No. PCT/US02/03379, filed Feb. 14, 2002, which discloses the contents of the integrated module that contains radiating elements, polarizing circuits, power dividing networks and filters. The radiating elements are electromagnetically coupled patches, and the polarizing circuits are hybrid couplers that provide the phase quadrature needed to produce circular polarizations. The phase shifters and other components can be implemented using MEMS technology. Although the invention disclosed in the above-mentioned International Application No. PCT/US02/03379 reduces the cost of making the active phased arrays due to the modularity of the design and the use of lower loss MEMS components, the production costs are still prohibitive for some applications.

The aforementioned related art has various problems and disadvantages. For example, but not by way of limitation, it is a disadvantage of the related art MEMS fabrication process that IC packaging processes must be used for manufacture of MEMS devices. As noted above, there are substantial structural and functional differences between IC and MEMS, including the need for MEMS to be manufactured in substantially continuous and intimate contact with their environment. Thus, the related art MEMS fabrication process is not efficient Further, in the related art, a new, specialized package must be created each time a new MEMS device is developed, at an additional time and financial cost. As a result, the related art MEMS fabrication process has another disadvantage and is one of the most expensive aspects of MEMS product development, as there are no related art standardized packages from which one would be able to choose a MEMS package for a new application without substantially compromising performance.

Also, the related art fabrication process has another disadvantage, due to its complexity, and requires a substantial research investment to generate a suitable fabrication sequence. Because the design is dependent on the fabrication, there is an additional cost in that process-independent design tools cannot be used by a MEMS designer.

SUMMARY OF THE INVENTION

It is an object of the present invention to overcome at least the aforementioned problems and disadvantages of the related art system.

It is another object of the present invention to provide a low-cost, efficient method of fabricating a phased array with MEMS technology.

It is still another object of the present invention to simplify the phased array fabrication process by using LTCC technology to manufacture substantially all layers of the phased array. The use of same or similar material for all the layers in the subarray structure reduces the thermal and mechanical stresses that may result from using dissimilar materials of different coefficients of thermal expansion.

To achieve at least the foregoing objects, a method of fabricating at least one subarray of at least one phased array is provided, comprising the steps of (a) forming a first layered substrate including at least one first device, (b) forming a micromachined device layer on the first layered substrate, and (c) forming a second layered substrate including at least one second device on the micromachined device layer, wherein a low temperature co-fired ceramic (LTCC) process is employed in (a), (b) and (c).

Additionally, a phased array device including at least one subarray the at least one subarray is provided, comprising. (a) a first layered substrate including at least one first device, (b) a micromachined device layer on the first layered substrate, and (c) a second layered substrate including at least one second device on the micromachined device layer, wherein said first layered substrate, said micromachined device layer and said second layered substrate are formed by a low temperature co-fired ceramic (LTCC) process.

BRIEF DESCRIPTION OF THE DRAWINGS

The accompanying drawings, which are included to provide a further understanding of illustrative, nonlimiting embodiments of the present invention and are incorporated in and constitute a part of this specification, illustrate embodiments of the invention and together with the description serve to explain the principles of the present invention.

DETAILED DESCRIPTION OF ILLUSTRATIVE EMBODIMENTS OF THE INVENTION

Figure 1:
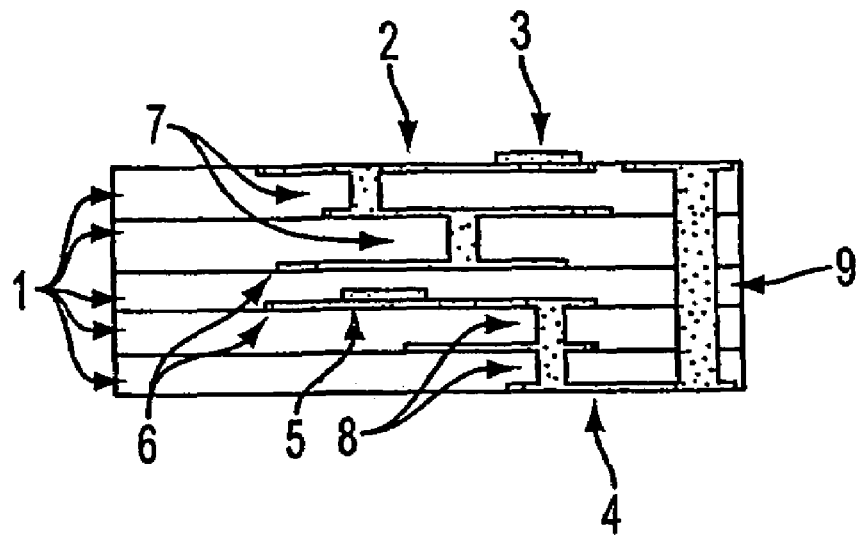
FIG. 1 illustrates a related art multiple-layer LTCC technology.

Reference will now be made in detail to an illustrative, non-limiting embodiment of the present invention, examples of which are illustrated in the accompanying drawings. In the present invention, the terms are meant to have the definition provided in the specification, and are otherwise not limited by the specification.

The present invention relates to a low cost phased array that is constructed using building blocks of subarray modules built in low temperature co-fired ceramic material (LTCC). The modules are highly integrated to include radiating elements and other components including, but not limited to phase shifters, polarizing circuits and filters. Each module includes a subarray of radiating elements and a number of electronic components that may include polarization circuits, phase shifters, power divider networks, and/or filters. The various components in the different layers are integrated together via vertical interconnects (e.g., vias) by using the LTCC material as the fabrication medium.

The subarray is an integration of multiple layers, with each layer containing a function. One or more of the layers may be constructed using Micro-Electro-Mechanical System (MEMS) technology. Additionally, a plurality of LTCC-based subarray modules may be arranged to produce a full phased array that may include transmitting and/or receiving arrays.

The LTCC has several desirable features as a substrate in microwave applications, including, but not limited to low cost, low loss, material stability and ease of stacking or vertical integration of printed circuit layers.

As noted above, the full array is constructed from the sub-array modules, and the number of subarray modules depends on the desired array size. As a result, the same subarray module can be used for different array sizes. The full array uses a power amplifier per sub-array module for the transmitting array or alternatively, a low-noise amplifier (LNA) per sub-array module for the receiving array. Due to the low loss feature of the LTCC, a single amplifier for the full array may be sufficient.

Related art low temperature co-fired ceramic (LTCC) technology provides a method of making multilayer circuits with single tapes that are used to apply various pastes (e.g., conductive, dielectric, resistive) to form a sheet The related art LTCC employs a low firing temperature (e.g., 850 degrees Celsius) so that low resistive materials (e.g., silver, gold) can be employed instead of high-temperature resistive materials (e.g., molybdenum, tungsten). The resultant sheet is laminated together and fired in a single step. Because each layer can be inspected prior to firing and replaced if necessary, there is no need to remanufacture an entire circuit if there is an error.

The related art LTCC technology is the most cost effective integration technology for wireless applications below 5 GHz. However, the losses of those related art LTCC materials at higher frequencies (e.g., 20 GHz and above) are unacceptable. Therefore, DuPont introduced a related art LTCC system (i.e., 943 Green Tape™) that is gold, silver and mixed metal compatible with low loss, low CTE, lead free glass/ceramic tape, as illustrated in FIG. 1.

FIG. 1 illustrates the related art Green Tape LTCC package as a 6 metal layer package. A plurality of Green Tape dielectric layers 1 are stacked next to one another, and there is a top side or an external conductor 2, to which a thick film dielectric or post fire resistor 3 may be attached, and a bottom side or external conductor 4. Buried resistors 5 are disclosed within the layers, as well as internal conductors 6, and vias 7 that interconnect different layers. Also, stacked vias 8 or thermal vias 9 may also be used.

However, in the related art, LTCC technology is not used in MEMS fabrication. The present invention applies LTCC to MEMS component fabrication in the wireless communication area The aforementioned related art LTCC technology lends itself to micro machining for direct processing of MEMS components, because the integrated sub-array module is rugged, power efficient and functional under normal environmental conditions.

Further, the LTCC material offers an attractive solution for the high cost, high loss and integration problems that are at least the aforementioned disadvantages of the related art media For example, but not by way of limitation, LTCC can inherently be processed as a multilayer structure. Hence, the ease of integration of different layers of the subarray module overcomes the related art problems. While the related art LTCC illustrated in FIG. 1 shows the above-described exemplary features, the usage of the LTCC in the present invention is not limited thereto, and may include alternative embodiments, arrangements of vias, and devices with the MEMS configuration of the exemplary embodiment of the present invention.

Figure 2:
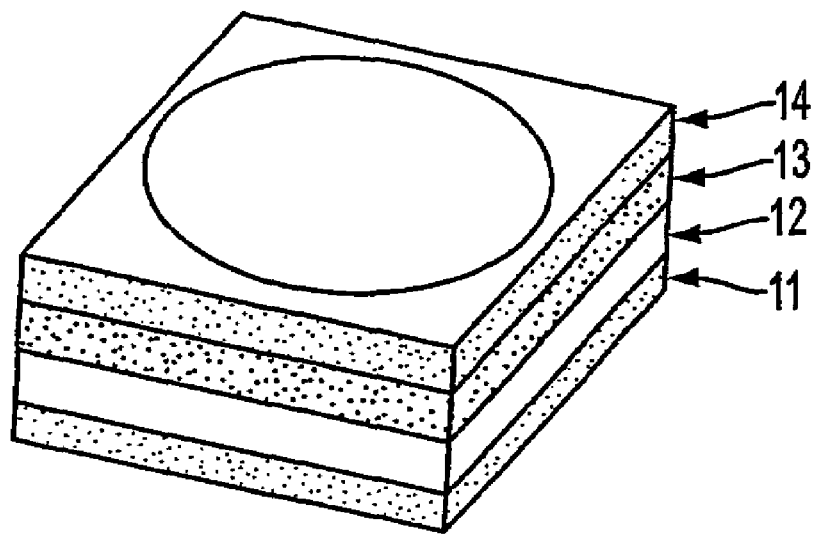
FIG. 2 illustrates a basic structure of an array element that uses LTCC according to an exemplary description of the present invention.

FIG. 2 shows the basic structure of the array element 10 (i.e., subarray) with a set of electronic components 11 . . . 13 that feed a radiating element 14 to produce the right polarization and phase shift. The power divider 11 and the polarizer 12 are formed as a first substrate layer, upon which the MEMS phase shifter 13 is fabricated. All of the aforementioned layers 11 . . . 14 of the array element are fabricated in LTCC. As a result of the use of same or similar material (i.e., LTCC) for all the layers in the subarray structure, thermal and mechanical stresses resulting from related art use of dissimilar materials of different coefficients of thermal expansion is substantially reduced.

Fabrication of the phase shifter 13 will likely determine the integration approach for the sub-array. The radiating element 14 is formed on the phase shifter as a second substrate layer. If the phase shifter is integrated in LTCC as a buried layer as illustrated in FIG. 2, the integration of the whole system may also be of the same LTCC material, with no significant integration issues, thus overcoming one of the aforementioned related art problems.

Based on the yield of the process, loss in each element, and output of the power amplifier, it is possible to fabricate Ka-band sub-arrays with up to 100 (approximately 5×5 cm) elements (e.g., array element 10) as a fully integrated package. Further, in the present invention using LTCC in the MEMS device, it is possible to obtain transmission line losses as low as 0.2 dB/cm at 30 GHz.

Figure 3:
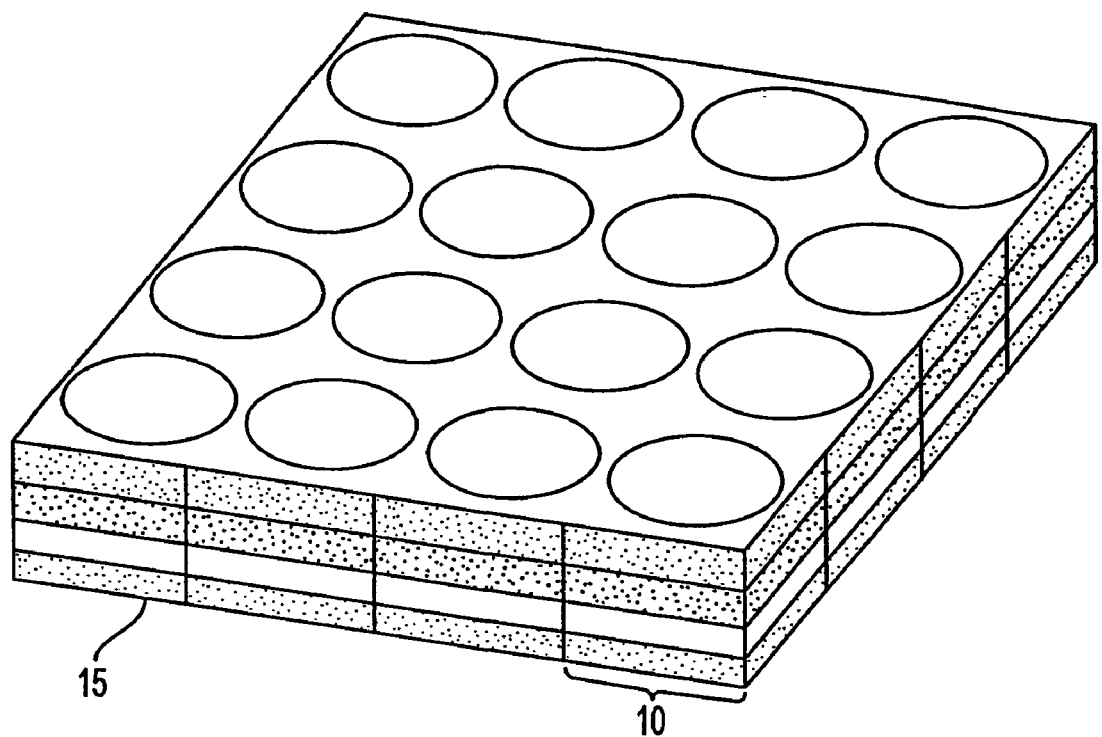
FIG. 3 illustrates a sub-array having multiple elements that employs LTCC according to the exemplary description of the present invention.

In the present invention, the operational sub-arrays (e.g., 10) can be integrated on a larger board using a procedure similar to flip-chip bonding. As illustrated in FIG. 3, a single LTCC module 15 with 16 elements (e.g., subarray 10) is shown.

Figure 4:
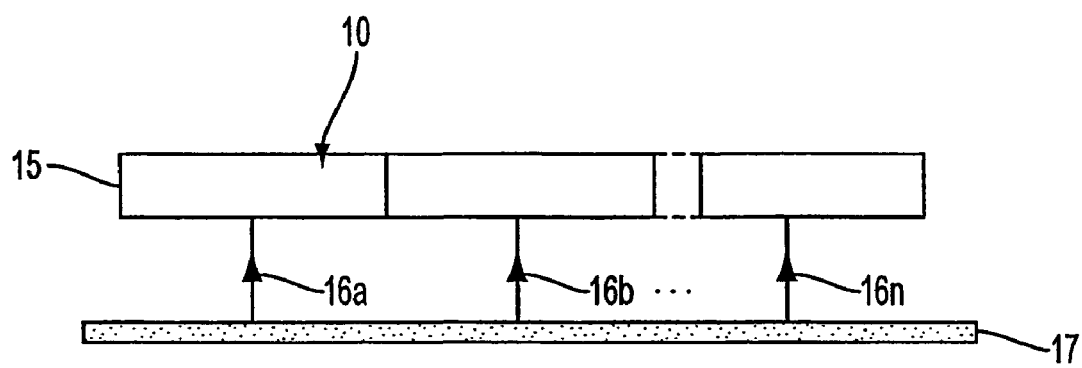
FIG. 4 illustrates a structure of a full phased array according to the exemplary description of the present invention.

Phase shifter modules can be flip-chip bonded on the backside of the sub-array, as illustrated in FIG. 4. Flip chip bonding using micro-ball-grid-array (BGA) compatible techniques can minimize problems due to differences in thermal expansion coefficients.

The sub-array module is used as a building block for the full array, as shown in FIG. 4. Amplifiers 16a . . . 16n are coupled between the full array 15 and a distribution network 17. One amplifier (e.g., 16a) each in a distributed power configuration feeds the sub-arrays (e.g., 10), or alternatively, the whole array is fed by a single amplifier, followed by a low-loss power dividing network.

Although the exemplary description of the present invention refers to a transmit array, the present invention is not limited thereto. For example, but not by way of limitation, the present invention can also include receive arrays having the substantially similar subarray module integration and beam steering ideas. In a receive array according to the present invention illustrated in FIG. 4 as an exemplary embodiment, the power dividing circuit acts as a power combining circuit, and the power amplifiers are replaced with low noise amplifiers. The circuit losses in the different layers are minimized to maximize the receive antenna G/T.

The present invention is applicable to low-cost phased array antennas for geostationary and non-geostationary satellite terminals, especially for Ku-, Ka- and V-band multimedia satellite systems. However, the present invention is not limited thereto, and may be applied to other applications as well.

The present invention has various advantages over the related art. For example, but not by way of limitation, because LTCC allows for single step firing, time and money are saved over the related art fabrication processes due to a reduction in the number of steps. Further, circuit dimensions are also reduced. Additionally, because each LTCC layer can be inspected and replaced if necessary prior to firing, it is not necessary to remanufacture the entire circuit due to inaccuracy or damage. Also, the low cost and low losses make LTCC ideal for low cost small terminals for satellite applications, as well as other phased array applications.

Additionally, LTCC technology is cost-effective compared with the related art fabrication technology (e.g., photolithography processing), as the patterning of layers is performed with a combination of screen-printing and photolithography, with most of the layers done by screen-printing. As a result, this method of the present invention reduces the processing cost of the integrated subarray module.

It is another advantage of the present invention that via holes can be easily opened and filled with conductor inks. For example, but not by way of limitation, up to 20 layers can be incorporated using vias as interconnects in LTCC technology, thus allowing construction of multiple layers by forming a phased array integrated in a single package, as illustrated in FIG. 1. The aforementioned LTCC process substantially eliminates the packaging issues regarding the passive layers, such as the power divider, couplers and radiating element. Also, because LTCC fabrication lines can handle up to 45×45 cm plates, it is possible to obtain large numbers (e.g., 100) of sub-arrays from a single plate. In the present invention, LTCC technology integrates and packages all the device layers necessary for the subarray module in a novel manner.

Further, it is another advantage of the present invention that the level of integration according to the present invention results in a rugged and power efficient module, significantly reduces the cost of phased array antenna systems and improves overall performance. Further, the modularity of the design simplifies the integration of the large phased array assembled using the subarray module as its building block.

Because a single material (i.e., LTCC) is used for fabrication of substantially all layers, the thermal and mechanical stresses that may result from using dissimilar materials of different coefficients of thermal expansion are reduced, which is another advantage of the present invention.

It will be apparent to those skilled in the art that various modifications and variations can be made to the described illustrative embodiments of the present invention without departing from the spirit or scope of the invention. Thus, it is intended that the present invention cover all modifications and variations of this invention consistent with the scope of the appended claims and their equivalents.

What is claimed is:

1. A method of fabricating at least one subarray of at least one phased array, comprising the steps of:
   (a) forming a first layered substrate including at least one first device;
   (b) forming a micromachined device layer on said first layered substrate; and
   (c) forming a second layered substrate including at least one second device on said micromachined device layer, wherein a low temperature co-fired ceramic (LTCC) process is employed in step (a), step (b) and step (c).

2. The method of claim 1, wherein step (a) comprises forming a polarizer on a power divider.

3. The method of claim 1, wherein a micromachined device in said micromachined device layer comprises a phase shifter.

4. The method of claim 1, wherein step (c) comprises forming a radiating element on said micromachined device layer.

5. The method of claim 1, wherein step (a), step (b) and step (c) are performed substantially simultaneously.

6. The method of claim 1, further comprising forming an interconnection between at least one of said first layered substrate, said micromachined device layer and said second layered substrate by a LTCC via formation process.

7. The method of claim 1, further comprising combining ones of said at least one subarray to form said at least one phased array in an antenna array system.

8. The method of claim 7, further comprising installing said antenna array system in a satellite terminal.

9. The method of claim 1, wherein at least one amplifier is coupled between corresponding ones of said at least one subarray and a distribution network.

10. The method of claim 9, wherein said at least one amplifier forms a power dividing circuit if said at least one phased array is a transmit array, and said at least one amplifier forms a power combining circuit if said at least one phased array is a receive array.

11. The method of claim 1, wherein a transmission line loss for said at least one phased array is 0.2 dB/cm at 30 GHz.

12. The method of claim 1, further comprising applying a flip chip bonding process to attach said first layered substrate to said micromachined device layer.

13. The method of claim 1, wherein said at least one subarray comprises a number of subarrays or elements being simultaneously fabricated.

14. A phased array device including at least one subarray said at least one subarray comprising: (a) a first layered substrate including at least one first device; (b) a micromachined device layer on said first layered substrate; and (c) a second layered substrate including at least one second device on said micromachined device layer wherein said first layered substrate, said micromachined device layer and said second layered substrate are formed by a low temperature co-fired ceramic (LTCC) process.

15. The device of claim 14, wherein step (a) comprises a polarizer formed on a power divider.

16. The device of claim 14, wherein a micromachined device in said micromachined device layer comprises a phase shifter.

17. The device of claim 14, wherein said second layered substrate is a radiating element.

18. The device of claim 14, wherein said first layered substrate, said micromachined device layer and said second layered substrate are formed substantially simultaneously.

19. The device of claim 14, further comprising interconnections between at least one of said first layered substrate, said micromachined device layer and said second layered substrate formed by a LTCC via formation process.

20. The device of claim 14, wherein ones of said at least one subarray are configured to be combined to form said at least one phased array in an antenna array system.

21. The device of claim 20, wherein said antenna array system is positioned in a satellite terminal.

22. The device of claim 14, wherein at least one amplifier is coupled between corresponding ones of said at least one subarray and a distribution network.

23. The device of claim 22, wherein said at least one amplifier comprises a power dividing circuit if said at least one phased array is a transmit array, and said at least one amplifier comprises a power combining circuit if said at least one phased array is a receive array.

24. The device of claim 14, wherein a transmission line loss for said at least one phased array is 0.2 dB/cm at 30 GHz.

25. The device of claim 14, wherein said at least one subarray comprises a number of subarrays or elements that are simultaneously fabricated.

* * * * *